US012701829B2

(12) United States Patent
Kim et al.

(10) Patent No.: US 12,701,829 B2
(45) Date of Patent: Aug. 4, 2026

(54) INORGANIC LIGHT EMITTING DIODE INCLUDING CONDUCTIVE MEMBERS, DISPLAY MODULE AND MANUFACTURING METHOD THEREOF

(71) Applicant: SAMSUNG ELECTRONICS CO., LTD., Suwon-si (KR)

(72) Inventors: Myunghee Kim, Suwon-si (KR); Taesoon Park, Suwon-si (KR); Bumki Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 527 days.

(21) Appl. No.: 17/826,441

(22) Filed: May 27, 2022

(65) Prior Publication Data

US 2023/0006104 A1     Jan. 5, 2023

Related U.S. Application Data

(63) Continuation of application No. PCT/KR2022/004342, filed on Mar. 28, 2022.

(30) Foreign Application Priority Data

Jun. 30, 2021     (KR) ........................ 10-2021-0085578
Aug. 25, 2021     (KR) ........................ 10-2021-0112686

(51) Int. Cl.
H10H 20/831     (2025.01)
H10H 20/01     (2025.01)
(Continued)

(52) U.S. Cl.
CPC ........ H10H 20/8312 (2025.01); H10H 20/01 (2025.01); H10H 20/857 (2025.01);
(Continued)

(58) Field of Classification Search
CPC . H01L 33/382; H01L 25/0753; H01L 33/005; H01L 33/62; H01L 2933/0016;
(Continued)

(56) References Cited

U.S. PATENT DOCUMENTS 8,941,215 B2     1/2015  Hu et al.
9,257,623 B2     2/2016  Kim et al.
(Continued)

FOREIGN PATENT DOCUMENTS

EP          3 844 818          12/2020
JP     2005322722 A  *  11/2005
(Continued)

OTHER PUBLICATIONS

Communication issued Jul. 2, 2024 by the European Patent Office in European Patent Application No. 22833358.9.
(Continued)

*Primary Examiner* — Mohammad M Hoque
(74) *Attorney, Agent, or Firm* — Sughrue Mion, PLLC

(57)     ABSTRACT

Provided is an inorganic light emitting device including a first semiconductor layer, a second semiconductor layer, an active layer disposed between the first semiconductor layer and the second semiconductor layer, a first electrode covered to the first semiconductor layer, a second electrode covered to the second semiconductor layer, an insulating layer covered the first electrode and the second electrode, and including via holes at positions corresponding to the first electrode and the second electrode, and a first conductive member and a second conductive member coupled to the first electrode and the second electrode, respectively, through the via holes, wherein a distance between the first conductive member and the second conductive member is greater than a distance between the first electrode and the second electrode.

14 Claims, 16 Drawing Sheets

(51) Int. Cl.

| | |
|---|---|
| *H10H 20/857* | (2025.01) |
| *H10W 90/00* | (2026.01) |

(52) U.S. Cl.

CPC .......... *H10W 90/00* (2026.01); *H10H 20/032* (2025.01); *H10H 20/0364* (2025.01)

(58) Field of Classification Search

CPC ........ H01L 2933/0066; H10H 20/8312; H10H 20/01; H10H 20/857; H10H 20/032; H10H 20/0364; H10H 20/831; H10H 20/84; H10H 20/852; H10W 90/00

USPC .......................................................... 257/79

See application file for complete search history.

(56) References Cited

U.S. PATENT DOCUMENTS

| | | | |
|---|---|---|---|
| 9,508,894 | B2 | 11/2016 | Lu et al. |
| 10,566,317 | B2 * | 2/2020 | Herner ................. H10H 20/825 |
| 11,081,028 | B2 | 8/2021 | Ohmae et al. |
| 2012/0241793 | A1 * | 9/2012 | In ....................... H10H 20/8506 |
| | | | 438/22 |
| 2015/0236228 | A1 | 8/2015 | Kim et al. |
| 2015/0280084 | A1 | 10/2015 | Sugawara |
| 2016/0365486 | A1 * | 12/2016 | Kim ........................ H01L 33/24 |
| 2017/0062514 | A1 * | 3/2017 | Park ................... H10D 30/6755 |
| 2018/0175268 | A1 * | 6/2018 | Moon .................. H10H 20/857 |
| 2019/0355702 | A1 * | 11/2019 | Herner ................... H10D 84/83 |
| 2020/0302835 | A1 | 9/2020 | Ohmae et al. |
| 2021/0005794 | A1 | 1/2021 | Sakong et al. |
| 2021/0057611 | A1 * | 2/2021 | Guo ........................ H10H 20/83 |
| 2021/0272824 | A1 | 9/2021 | An et al. |
| 2021/0343784 | A1 | 11/2021 | Kwag et al. |
| 2021/0343905 | A1 | 11/2021 | Kishimoto |
| 2022/0375915 | A1 * | 11/2022 | Kim ..................... H01L 25/167 |

FOREIGN PATENT DOCUMENTS

| | | | |
|---|---|---|---|
| JP | 5150361 B2 | | 2/2013 |
| KR | 10-2013-0062958 A | | 6/2013 |
| KR | 20140063560 A | * | 5/2014 |
| KR | 10-2015-0097021 A | | 8/2015 |
| KR | 10-2017-0010132 A | | 1/2017 |
| KR | 10-1873503 B1 | | 7/2018 |
| KR | 10-2018-0127968 A | | 11/2018 |
| KR | 10-1972480 B1 | | 4/2019 |
| KR | 10-2020-0042997 A | | 4/2020 |
| KR | 10-2020-0136807 A | | 12/2020 |
| KR | 10-2021-0005454 A | | 1/2021 |
| KR | 10-2021-0031136 A | | 3/2021 |
| WO | 2020/100290 A1 | | 5/2020 |

OTHER PUBLICATIONS

Communication dated Jul. 29, 2022, issued by the International Searching Authority in counterpart International Application No. PCT/KR2022/004342 (PCT/ISA/210 and PCT/ISA/237).

Office Action dated Sep. 12, 2025, issued by the Korean Patent Office in Korean Patent Application No. 10-2021-0112686.

* cited by examiner

INORGANIC LIGHT EMITTING DIODE INCLUDING CONDUCTIVE MEMBERS, DISPLAY MODULE AND MANUFACTURING METHOD THEREOF

CROSS-REFERENCE TO RELATED APPLICATIONS

This application is a bypass continuation of International Application No. PCT/KR2022/004342, filed on Mar. 28, 2022, which is based on and claims priority to Korean Patent Application No. 10-2021-0085578, filed on Jun. 30, 2021, in the Korean Intellectual Property Office and Korean Patent Application No. 10-2021-0112686, filed on Aug. 25, 2021, in the Korean Intellectual Property Office, the disclosures of which are incorporated by reference herein in their entireties.

BACKGROUND

Embodiments of the present disclosure relate to an inorganic light emitting device, a display module, and a manufacturing method thereof.

A self-emissive display device displays an image without a color filter and a back light, and may use an inorganic light emitting device emitting light on its own.

The display module may represent various colors while being operated in pixel or sub pixel units formed of the inorganic light emitting devices. The respective pixels or sub pixels may be configured such that an operation is controlled by a thin film transistor (TFT). A plurality of TFTs may be arranged on a flexible substrate, glass substrate or a plastic substrate. Accordingly, a substrate provided with the plurality of TFTs may be referred to as a TFT substrate.

Recently, a display module in which a micro LED of less than or equal to 100 μm is mounted to the TFT substrate is being developed. However, when an anode electrode and a cathode electrode provided in the micro LED are disposed at a same surface, a distance between electrodes may be relatively small. Accordingly, when using an anisotropic conductive film (ACF) as a bonding layer when transferring the micro LED to the TFT substrate, there has been the problem of a short occurring between the electrodes due to conductive balls positioned between the electrodes included in the ACF.

SUMMARY

One or more embodiments provide an inorganic light emitting device capable of minimizing an occurrence of a short between electrodes of an inorganic light emitting device, a display module and a manufacturing method thereof.

According to an aspect of an example embodiment, there is provided an inorganic light emitting device including a first semiconductor layer, an active layer on the first semiconductor layer, a second semiconductor layer on the active layer, a first electrode on the first semiconductor layer, a second electrode on the second semiconductor layer, an insulating layer on the first electrode and the second electrode, and including via holes at positions corresponding to the first electrode and the second electrode, and a first conductive device and a second conductive device on the first electrode and the second electrode, respectively, through the via holes, wherein a distance between the first conductive device and the second conductive device is greater than a distance between the first electrode and the second electrode.

A width of the first conductive device may be narrower than a width the first electrode.

A width of the second conductive device may be narrower than a width the second electrode.

The first conductive device and the second conductive device may include PEDOT:PSS (poly(3,4-ethylenedioxy-thiophene):poly(styrenesulfonate)).

The insulating layer may include benzo cyclo butene (BCB), polyimide or epoxy.

According to another aspect of an example embodiment, there is provided a display device including a substrate including a thin film transistor (TFT) layer that includes a TFT circuit and electrode pads on the TFT layer, a plurality of inorganic light emitting devices respectively including a first electrode and a second electrode connected with the electrode pads, an insulating layer between the substrate and the plurality of inorganic light emitting devices, and a first conductive device and a second conductive device configured to electrically connect the first electrode and the second electrode with the plurality of electrode pads, wherein a distance between the first conductive device and the second conductive device is greater than a distance between the first electrode and the second electrode.

The first conductive device may be between the first electrode and a corresponding electrode pad among the plurality of electrode pads, and the second conductive device may be between the second electrode and another corresponding electrode pad among the plurality of electrode pads.

A width of the first conductive device may be narrower than a width of the first electrode.

A width of the second conductive device may be narrower than a width of the second electrode.

The insulating layer may include vias formed at positions corresponding to the first electrode and the second electrode, and the first conductive device and the second conductive device may be disposed in the vias.

The plurality of inorganic light emitting devices respectively may include the insulating layer and the first conductive device and the second conductive device.

The substrate may include the insulating layer and the first conductive device and the second conductive device.

According to another aspect of an example embodiment, there is provided a manufacturing method of a display module, the method including growing an inorganic light emitting device on an epitaxial substrate, forming a first electrode and a second electrode in the inorganic light emitting device, forming an insulating layer in the inorganic light emitting device on the first electrode and the second electrode, forming a first via and a second via at positions corresponding to the first electrode and the second electrode in the insulating layer, filling the first via and the second via and forming a first conductive device and a second conductive device, and transferring the inorganic light emitting device to a substrate on which a thin film transistor (TFT) layer is formed.

A distance between the first conductive device and the second conductive device may be wider than a distance between the first electrode and the second electrode.

A width of the first via may be formed to be narrower than a width of the first electrode, and a width of the second via may be formed to be narrower than a width of the second electrode.

The first conductive device may have a circular shape in a plan view, and the second conductive device may have a ring shape in the plan view.

The first conductive device and the second conductive device may include PEDOT:PSS (poly(3,4-ethylenedioxy-thiophene):poly(styrenesulfonate)).

According to another aspect of an example embodiment, there is provided a display device including a substrate including a thin film transistor (TFT) layer that includes a first electrode pad and a second electrode pad, an inorganic light emitting device including a first electrode and a second electrode electrically connected to the first electrode pad and the second electrode pad, respectively, an insulating layer between the substrate and the inorganic light emitting device, and a first conductive device between the first electrode and the first electrode pad, and a second conductive device between the second electrode and the second electrode pad, wherein a distance between the first conductive device and the second conductive device is greater than a distance between the first electrode and the second electrode.

A width of the first conductive device may be narrower than a width of the first electrode.

A width of the second conductive device may be narrower than a width of the second electrode.

According to an embodiment, based on first and second conductive members coupled to the first and second electrodes of the inorganic light emitting device, respectively, being provided, a short which may occur due to the narrow distance between the first and second electrodes may be prevented from occurring between the first and second electrodes.

In addition, according to an embodiment, based on using an insulating layer which is a non-conductive polymer as a bonding material when thermal compressing the inorganic light emitting device to the TFT substrate, a short defect may be minimized compared to when the anisotropic conductive film (ACF) is used as an adhesive layer, and defects by squeeze-out may be minimized compared to an electrode bonding method.

In addition, according to an embodiment, based on stress generated between the first and second conductive members and the first and second electrode pads when performing the thermal compression being equally distributed by the insulating layer, a crack occurring in the inorganic light emitting device by a pressing force when performing the thermal compression may be minimized.

BRIEF DESCRIPTION OF DRAWINGS

The above and/or other aspects and features of the present disclosure will become more apparent by describing in detail example embodiments thereof with reference to the attached drawings, in which.

DETAILED DESCRIPTION

Figure 1:
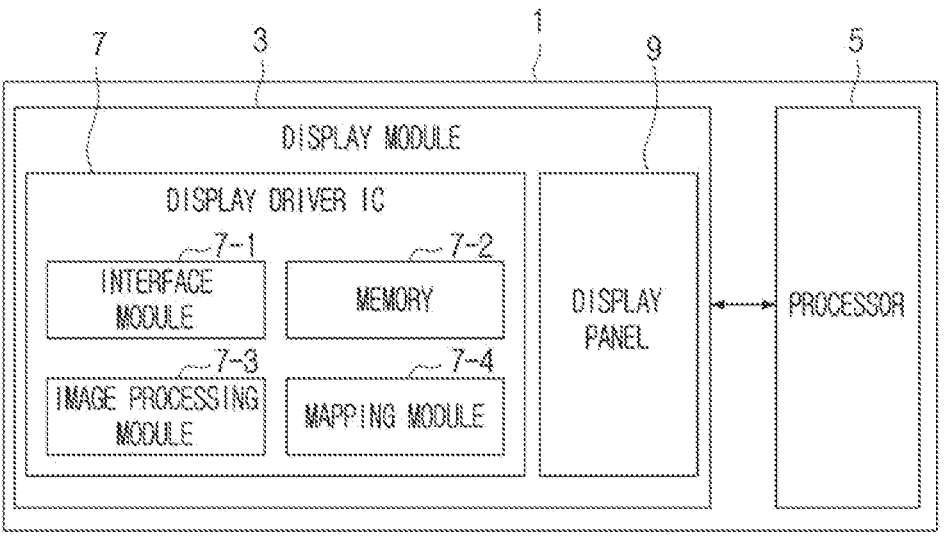
FIG. 1 is a block diagram illustrating a display device according to an embodiment.

Various embodiments will be described in greater detail below with reference to the accompanied drawings. The embodiments described herein may be variously modified. Specific embodiments may be illustrated in the drawings and described in detail in the description. However, the specific embodiments described in the accompanied drawings are merely to assist in the understanding of the various embodiments. Accordingly, the various embodiments disclosed in the accompanied drawings are not for limiting the scope of the disclosure to a specific embodiment, and should be interpreted to include all modifications or alternatives included in the technical spirit and scope of the embodiments.

Terms including ordinal numbers such as first, second, and the like may be used to describe various elements, but these elements are not limited by the above-described terms. The above-described terms may be used only to distinguish one element from another element.

In the disclosure, it is to be understood that the terms such as "comprise," "include," or the like are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being "coupled with/to" or "connected to" another element, it is to be understood that the certain element may be directly coupled to or connected to another element, but that another element may be present therebetween. On the other hand, when a certain element is indicated as being "directly coupled with/to" or "directly connected to" another element, it is to be understood that another element is not present therebetween.

In the disclosure, the expression 'same' may not only mean fully matching, but also include a difference to a degree of taking into consideration a processing error range.

In addition thereto, in describing an embodiment, in case it is determined that the detailed description of related known technologies may unnecessarily confuse the gist of the disclosure, the detailed description thereof will be abridged or omitted.

In the present disclosure, a display module may include a display panel provided with an inorganic light emitting diode for displaying an image. Here, the display panel may be a flat panel display panel or a curved display panel, and because a plurality of inorganic light emitting diodes (inorganic LEDs; e.g., micro LEDs or mini LEDs) of less than or equal to 100 μm is mounted, it may provide better contrast, response time, and energy efficiency compared to a liquid crystal display (LCD) which requires a backlight. In the present disclosure, the 'inorganic light emitting diode' and the 'inorganic light emitting device' may be used interchangeably.

The inorganic light emitting device applied in the present disclosure may have longer brightness, light-emitting efficiency, and life span than an organic light-emitting diode (OLED). The inorganic light emitting device may be a semiconductor chip configured to emit light on its own when power is supplied. A micro LED, which is an inorganic light emitting device, may have a relatively fast response rate, low power, and a high brightness. For example, the micro LED may have higher efficiency in converting electricity to photons compared to the LCD or the OLED of the related art. For example, a brightness per watt of the micro LED may be higher compared to the LCD or the OLED display of related art. Accordingly, the micro LED may be configured to show a same brightness with about half of an energy compared to the LED (width, length and height respectively exceeding 100 µm) or the OLED of related art.

In addition to the above, the micro LED may realize a relatively high resolution, a superior color, shading and brightness, express color of a wide range accurately, and realize a screen that is clear even in the outdoors where sunlight is bright. Further, the micro LED may be guaranteed a long life span because it is resistant against a burn in phenomenon and there is no deformation due to little heat being generated. The micro LED may have a flip chip structure in which an anode electrode and a cathode electrode are formed at a same first surface and a light-emitting surface is formed at a second surface positioned at an opposite side of the first surface at which the electrodes are formed.

In an embodiment, a substrate may be disposed with a TFT layer on which a thin film transistor (TFT) circuit is formed at a front surface, and disposed with a timing controller configured to control a power supply circuit and a data driving driver configured to supply power to a TFT circuit, a gate driving driver and respective driving drivers at the rear surface. Multiple pixels arranged on the TFT layer may be driven by the TFT circuit.

In an embodiment, the TFT provided in the display module may be, for example, a low-temperature polycrystalline silicon (LTPS) TFT, a low-temperature polycrystalline oxide (LTPO) TFT, or an oxide TFT In an embodiment, a glass substrate, a synthetic resin-based (e.g., polyimide (PI), polyethylene terephthalate (PET), polyethersulfone (PES), polyethylene naphthalate (PEN), polycarbonate (PC), etc.) substrate having a flexible material, or a ceramic substrate may be used as the substrate.

In an embodiment, the TFT layer on which the TFT circuit is formed may be disposed at the front surface of the substrate, and a circuit may not be disposed at the rear surface of the substrate. The TFT layer may be formed integrally on the substrate or attached to one surface of the glass substrate manufactured in a separate film form.

In an embodiment, the front surface of the substrate may be divided into an active area and a dummy area. The active area may correspond to an area occupied by the TFT layer at the front surface of the substrate, and the dummy area may be an area excluding the area occupied by the TFT layer at the front surface of the substrate.

In an embodiment, an edge area of the substrate may be an outermost side area of the glass substrate. In addition, the edge area of the substrate may be a remaining area excluding an area at which a circuit of the substrate is formed. In addition, the edge area of the substrate may include a part of the front surface of the substrate which is adjacent to a side surface of the substrate and a part of the rear surface of the substrate which is adjacent to the side surface of the substrate. The substrate may be formed as a quadrangle type. For example, the substrate may be formed as a rectangle type or a square type. The edge area of the substrate may include at least one side from among the four sides of the glass substrate.

In an embodiment, the TFT comprising the TFT layer (or backplane) is not limited to a specific structure or type. For example, the TFT may be realized as an oxide TFT and an Si TFT (poly silicon, a-silicon), an organic TFT, a graphene TFT, and the like in addition to a low-temperature polycrystalline silicon TFT (LTPS TFT), and may be applied by making only a P type (or N type) metal-oxide-semiconductor field-effect transistor (MOSFET) in a Si wafer complementary metal-oxide-semiconductor (CMOS) process.

In an embodiment the substrate included in the display module is not limited to the TFT substrate. For example, the display module may be a substrate without the TFT layer formed with the TFT circuit. In this case, the display module may include a substrate with a micro integrated circuit (IC) separately mounted and only wiring patterned.

In an embodiment, a pixel driving method of the display module may be an active matrix (AM) driving method or a passive matrix (PM) driving method. The display module may be configured to form a wiring pattern to which the respective micro LEDs are electrically connected according to the AM driving method or the PM driving method.

In an embodiment, the display module may include the glass substrate on which multiple LEDs are mounted and side wiring is formed. The display module as described above may be installed, as a single unit, in a wearable device, a portable device, a handheld device, and an electronic product requiring various displays or applied in an electric field, and may be applied to a display device such as, for example, and without limitation, a monitor for a personal computer (PC), a high resolution TV and signage (or, digital signage), an electronic display, or the like through a plurality of assemblies as a matrix type.

The display module of an embodiment may include multiple inorganic light emitting devices for displaying an image which are arranged on the substrate on which the thin film transistor is formed at one surface. The multiple inorganic light emitting devices may be sub pixels forming a single pixel. In the present disclosure, one 'micro LED' and one 'sub pixel' may be used interchangeably.

Embodiments of an embodiment will be described in detail with reference to the accompanied drawings to aid in the understanding of those of ordinary skill in the art. However, an embodiment may be realized in various different forms and it should be noted that the disclosure is not limited to the various embodiments described herein. Further, in the drawings, parts not relevant to the description may be omitted, and like reference numerals may be used to indicate like elements throughout the whole disclosure.

Furthermore, although embodiments of the disclosure have been described in detail below with reference to the accompanied drawings and the descriptions of the accompanied drawings, the disclosure is not limited to the embodiments.

The display device according to the various embodiments of the disclosure will be described below with reference to the drawings.

FIG. 1 is a block diagram illustrating a display device according to an embodiment.

Referring to FIG. 1, the display device 1 according to an embodiment may include a display module 3 and a processor 5.

The display module 3 according to an embodiment of the disclosure may be configured to display various images. Here, the image may include a still image and/or a moving image. The display module 3 may be configured to display various images such as a broadcast content and a multimedia content. In addition, the display module 3 may be configured to display a user interface and an icon.

The display module 3 may include a display panel 9 and a display driver IC (DDI) 7 configured to control the display panel 9.

The display driver IC 7 may include an interface module 7-1, a memory 7-2 (e.g., buffer memory), an image processing module 7-3, or a mapping module 7-4. The display driver IC 7 may be configured to receive, for example, image information including image data or an image control signal corresponding to instructions for controlling the image data from another element of the display device 1 through the interface module 7-1. For example, according to an embodiment, the image information may be received from the processor 5 (e.g., main processor (e.g., application processor)) or an auxiliary processor (e.g., graphic processing unit) operated independently from a function of the main processor.

The display driver IC 7 may be configured to perform communication through a sensor module and the interface module 7-1. In addition, the display driver IC 7 may be configured to store at least some from among the received image information in the memory 7-2 in, for example, frame units. The image processing module 7-3 may be configured to perform, for example, pre-processing or post-processing (e.g., resolution, brightness, or size adjustment) on at least some of the image data based on at least characteristics of the image data or characteristics of the display panel 9. The mapping module 7-4 may be configured to generate a voltage value or a current value corresponding to the pre-processed or post-processed image data through the image processing module 7-3. According to an embodiment, the generating of the voltage value or the current value may be, for example, performed at least in part based on the characteristics of the pixels (e.g., arrangement of the pixels (a RGB stripe or a pentile structure), or sizes of the respective sub pixels) of the display panel 9. Based on at least some pixels of the display panel 9 being driven, for example, based at least in part on the voltage value and the current value, visual information (e.g., text, image, or icon) corresponding to the image data may be displayed through the display panel 9.

The display driver IC 7 may be configured to transmit, based on image information received from the processor 5, a driving signal (e.g., driver driving signal, gate driving signal, etc.) to the display.

The display driver IC 7 may be configured to display an image based on the image signal received from the processor 5. In an example, the display driver IC 7 may be configured to generate a driving signal of a plurality of sub pixels based on the image signal received from the processor 5, and display an image by controlling an emission of the multiple sub pixels based on the driving signal.

The display module 3 may further include a touch circuit. The touch circuit may include a touch sensor and a touch sensor IC for controlling the touch sensor. The touch sensor IC may be configured to control the touch sensor to, for example, detect a touch input or a hovering input with respect to a designated position of the display panel 9. For example, the touch sensor IC may be configured to detect the touch input or the hovering input by measuring a change in signal (e.g., voltage, light amount, resistance, or charge amount) with respect to the designated position of the display panel 9. The touch sensor IC 1653 may be configured to provide information (e.g., position, area, pressure, or time) on the detected touch input or hovering input to the processor 5. According to an embodiment, at least a part of the touch circuit (e.g., touch sensor IC) may be included as a part of the display driver IC 7 or the display panel 9, or as a part of another element (e.g., auxiliary processor) disposed outside of the display module 3.

The processor 5 may be realized, for example, and without limitation, as a digital signal processor (DSP) for processing a digital image signal, a microprocessor, a graphics processing unit (GPU), an artificial intelligence (AI) processor, a neural processing unit (NPU), a time controller (TCON), or the like. However, embodiments are not limited thereto. For example, and without limitation, the processor 5 may be realized as one or more from among a central processing unit (CPU), a micro controller unit (MCU), a micro processing unit (MPU), a controller, an application processor (AP), a communication processor (CP), an ARM processor, or the like, or may be defined by the corresponding term. In addition, the processor 5 may be realized as a System on Chip (SoC) or a large scale integration (LSI) in which a processing algorithm is embedded, and may be realized in the form of an application specific integrated circuit (ASIC) and a field programmable gate array (FPGA).

The processor 5 may be configured to control hardware or software elements coupled to the processor 5 by operating an operating system or an application program, and perform various data processing and calculations. In addition, the processor 5 may be configured to load instructions or data received from at least one from among the other elements in a volatile memory and process the received instructions or data, and store the various data in a non-volatile memory.

Figure 2:
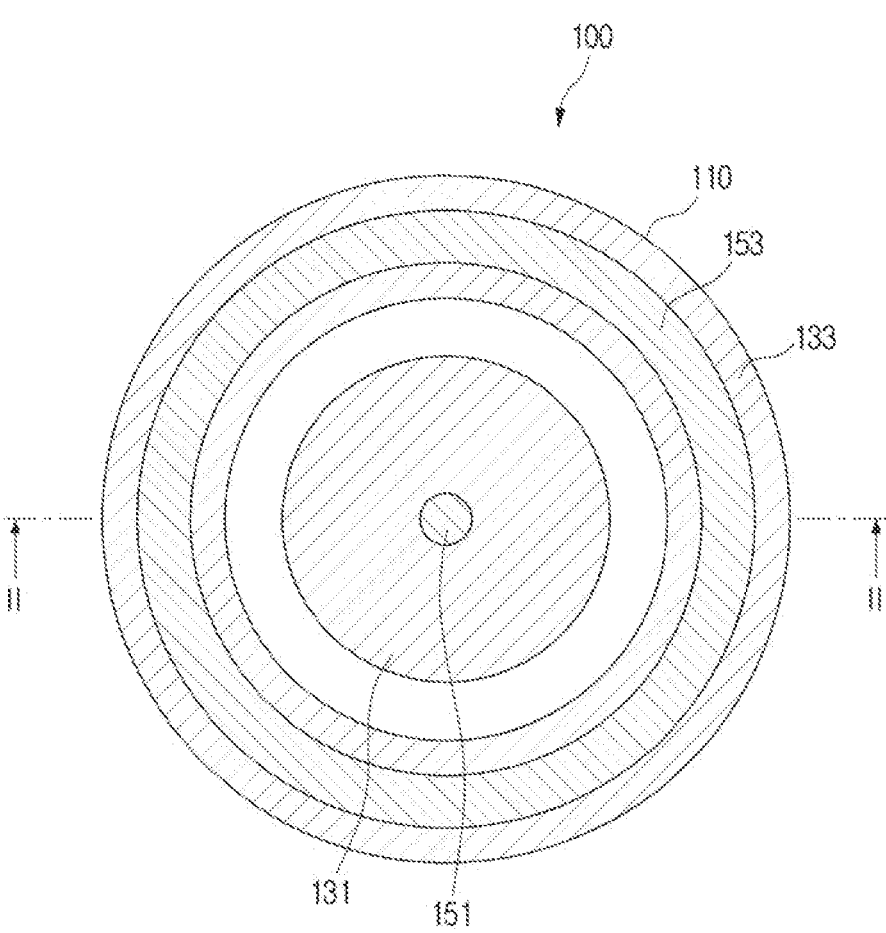
FIG. 2 is a plan view illustrating an inorganic light emitting device according to an embodiment.
Figure 3:
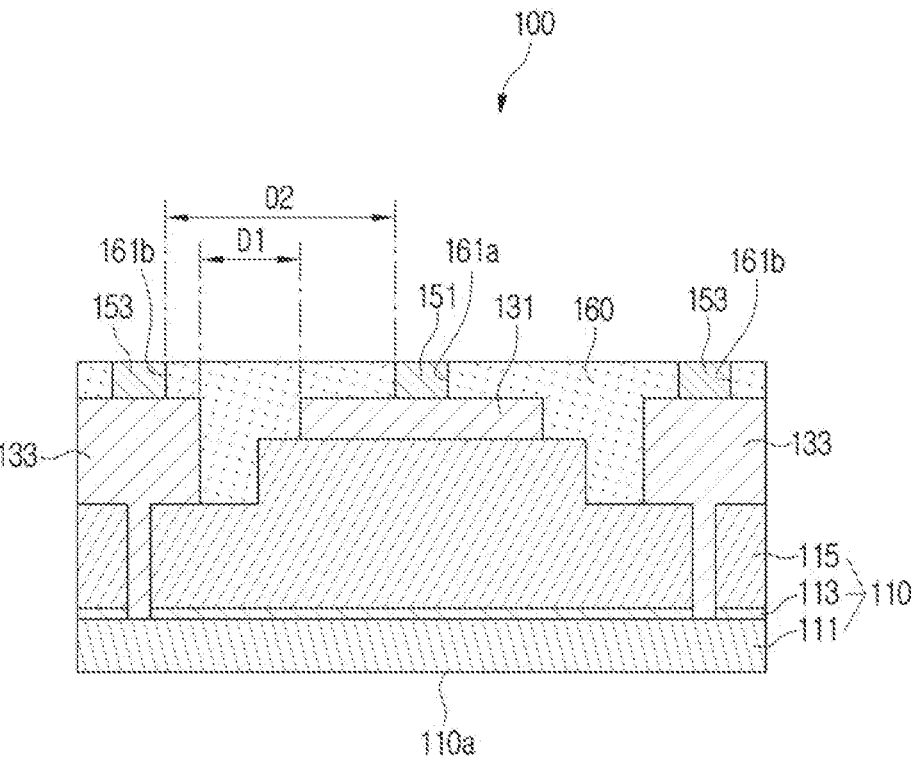
FIG. 3 is a cross-sectional view taken along line II-II shown in FIG. 2.

FIG. 2 is a plan view illustrating an inorganic light emitting device according to an embodiment, and FIG. 3 is a cross-sectional view of an inorganic light emitting device according to an embodiment taken along line II-II shown in FIG. 2.

Referring to FIG. 2 and FIG. 3, the inorganic light emitting device 100 according to an embodiment may be a micro light emitting diode (LED) having a size of less than or equal to about 50 μm. The inorganic light emitting device 100 may be a flip chip type in which a first electrode 131 and a second electrode 133 are both disposed at an opposite surface of a light emitting surface 110*a*. However, embodiments are not limited thereto, and the inorganic light emitting device 100 may be a lateral chip type or a vertical chip type.

The inorganic light emitting device 100 may be configured such that an epitaxially grown part 110 from an epitaxial substrate 101 (referring to FIG. 5) may include an active layer 113 which is disposed between a first semiconductor layer 111, a second semiconductor layer 115, a first semiconductor layer 111 and a second semiconductor layer 115.

The first semiconductor layer 111 may include, for example, a p-type semiconductor layer (anode, oxide electrode). The p-type semiconductor layer may be selected from, for example, gallium nitride (GaN), aluminum nitride (AN), aluminum gallium nitride (AlGaN), indium gallium nitride (InGaN), indium nitride (InN), indium aluminum gallium nitride (InAlGaN), aluminum indium nitride (AlInN), and the like, and may be doped with a p-type dopant such as magnesium (Mg), zinc (Zn), calcium (Ca), strontium (Sr), and barium (Ba).

The second semiconductor layer 115 may include, for example, an n-type semiconductor layer (cathode, reduction electrode). The n-type semiconductor layer may be selected from, for example, GaN, AlN, AlGaN, InGaN, InN, InAlGaN, AlInN, and the like, and may be doped with an n-type dopant such as silicon (Si), germanium (Ge) and tin (Sn).

The epitaxially grown part 110 of the inorganic light emitting device 100 is not limited to the above-described configuration, and for example, the first semiconductor layer 111 may include the n-type semiconductor layer and the second semiconductor layer 115 may include the p-type semiconductor layer. The active layer may be an area in which electrons and holes are recombined, which transitions to a low energy level as electrons and holes recombine, and may generate light having an wavelength corresponding thereto.

The active layer 113 may include a semiconductor material such as, for example, an amorphous silicon or a poly crystalline silicon. However, embodiments are not limited thereto, and may comprise an organic semiconductor material, and may be formed in a single quantum well (SQW) structure or a multi quantum well (MQW) structure.

The inorganic light emitting device 100 may be configured such that the first electrode 131 and the second electrode 133 are disposed at the opposite surface of the light emitting surface 110a. Based on the first electrode 131 being an anode electrode, the second electrode 133 may be a cathode electrode. The first and second electrodes 131 and 133 may be formed of an alloy comprising silver (Ag) or gold (Au), but is not limited thereto.

The inorganic light emitting device 100 may be formed in a form in which the second electrode 133 is surrounding the first electrode 131. However, the embodiment is not limited thereto, and in certain cases, the position of the first and second electrodes 131 and 133 may be interchanged.

The inorganic light emitting device 100 may include an insulating layer 160 which covers the first electrode 131 and the second electrode 133, a first conductive member 151 and a second conductive member 153.

The first conductive member 151 may be coupled with the first electrode 131 physically and electrically through a first via 161a formed at the insulating layer 160. In addition, the second conductive member 153 may be coupled with the second electrode 133 physically and electrically through a second via 161b formed at the insulating layer 160.

The first conductive member 151 may be formed on the first electrode 131, and a width of the first conductive member 151 may be formed smaller than a width of the first electrode 131. The second conductive member 153 may be formed on the second electrode 133, and a width of the second conductive member 153 may be formed smaller than a width of the second electrode 133. In this case, a distance D2 between the first conductive member 151 and the second conductive member 153 may be formed wider than a distance D1 between the first electrode 131 and the second electrode 133.

Accordingly, an ultra-small inorganic light emitting device 100 according to an embodiment may prevent a short from occurring between the first and second electrodes 131 and 133, which occurs because the distance D1 between the first and second electrodes 131 and 133 is narrow when performing transfer process.

The first conductive member 151 and the second conductive member 153 may be formed of a conductive material, and may, for example, be PEDOT:PSS (poly(3,4-ethylene-dioxythiophene):poly(styrenesulfonate)) which is a conductive polymer. The PEDOT:PSS may have superior electrical conductivity, light transmittance, and flexibility.

The insulating layer 160 may be configured to cover the opposite surface of the light emitting surface 110a and the first and second electrodes 131 and 133. The insulating layer 160 may be formed of a non-conductive material, and may be formed with, for example, benzo cyclo butene (BCB), polyimide, epoxy, or the like. The insulating layer 160 may function as an adhesive layer fixing the inorganic light emitting device 100 to a substrate 210 when performing a bonding process (referring to FIG. 14).

The inorganic light emitting device 100 may be configured such that light is emitted to the side surfaces of the light emitting surface 110a and the inorganic light emitting device 100, respectively. A passivation layer may be formed at the side surface of the inorganic light emitting device 100 to protect the side surface in certain cases. Based on transparency of the passivation layer being relatively low and reflectivity being relatively high, the amount of light emitted to the side surface of the inorganic light emitting device 100 may be greatly reduced, and the light which was emitted to the side surface may be emitted to the light emitting surface 110a by being reflected from the passivation layer.

The inorganic light emitting device 100 has been illustrated as a circular type as in FIG. 2 when viewed from a plan view, but is not limited thereto, and may be manufactured to an appropriate shape according to a required condition such as an elliptical type or a quadrangle type.

A manufacturing method of a display module according to an embodiment will be described below with reference to the drawings.

Figure 4:
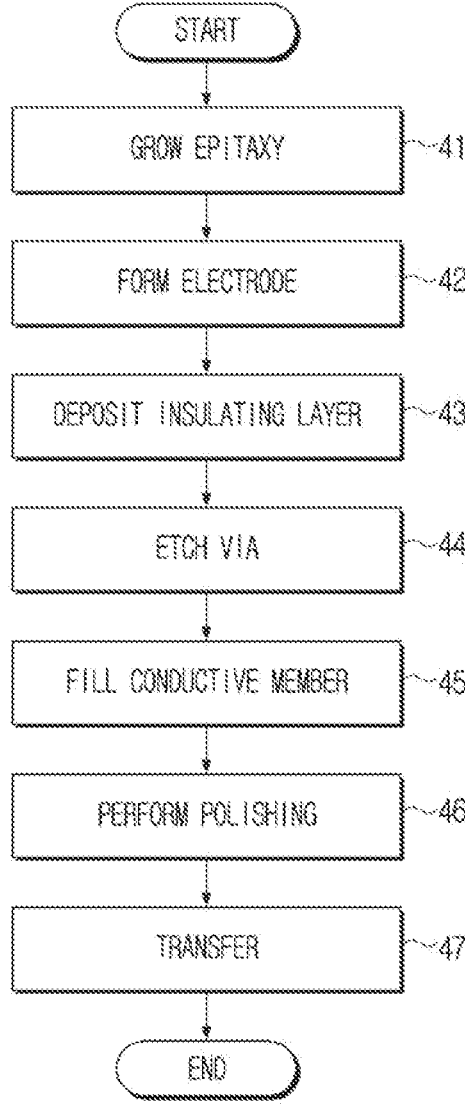
FIG. 4 is a flowchart illustrating a manufacturing method of a display module according to an embodiment.

FIG. 4 is a flowchart illustrating a manufacturing method of a display module according to an embodiment, and FIGS. 5 to 14 are diagrams illustrating respectively a manufacturing process of a display module according to an embodiment.

Figure 5:
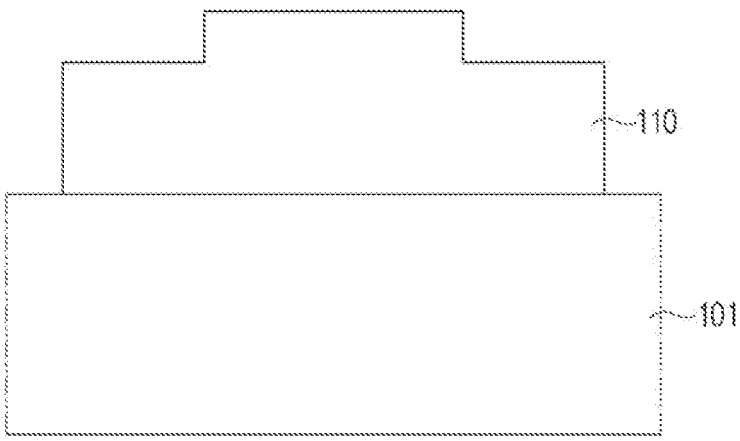
FIGS. 5, 6, 7, 8, 9, 10, 11, 12, 13, and 14 are diagrams illustrating respectively a manufacturing process of a display module according to an embodiment.

Referring to FIG. 5, the multiple inorganic light emitting devices 100 may be epitaxially grown on the epitaxial substrate 101 (41). In an embodiment, only one inorganic light emitting device 100 is illustrated for convenience of description, but embodiments are not limited thereto.

The epitaxially grown part 110 may include the first semiconductor layer 111, the second semiconductor layer 115, and the active layer 113 disposed between the first semiconductor layer 111 and the second semiconductor layer 115 (referring to FIG. 3).

The first semiconductor layer 111, the active layer 113, and the second semiconductor layer 115 may be formed by using methods such as a metal organic chemical vapor deposition (MOCVD), a chemical vapor deposition (CVD), and a plasma-enhanced chemical vapor deposition (PECVD).

The one side of the epitaxially grown part 110, that is the surface contacting with the epitaxial substrate 101, may function as the light emitting surface, and the opposite surface of the light emitting surface may be disposed with the first electrode 131 and the second electrode 133.

Figure 6:
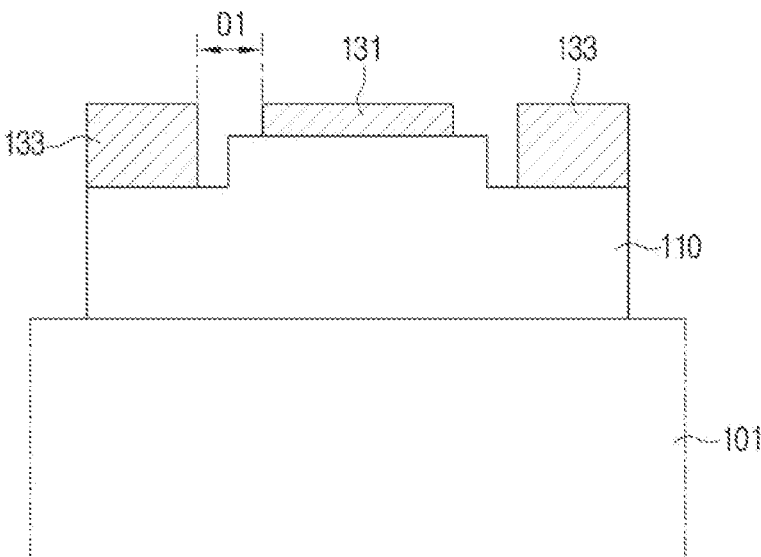

Referring to FIG. 6, the first electrode 131 and the second electrode 133 may be formed to respectively couple to the first and second semiconductor layers of the epitaxially grown part 110 respectively arranged at a predetermined distance D1 (42).

The first and second electrodes 131 and 133 may be formed by, for example, depositing a metal material through a deposition process such as sputtering, and be respectively formed on the first and second semiconductor layers through a photolithography process and an etching process.

Figure 7:
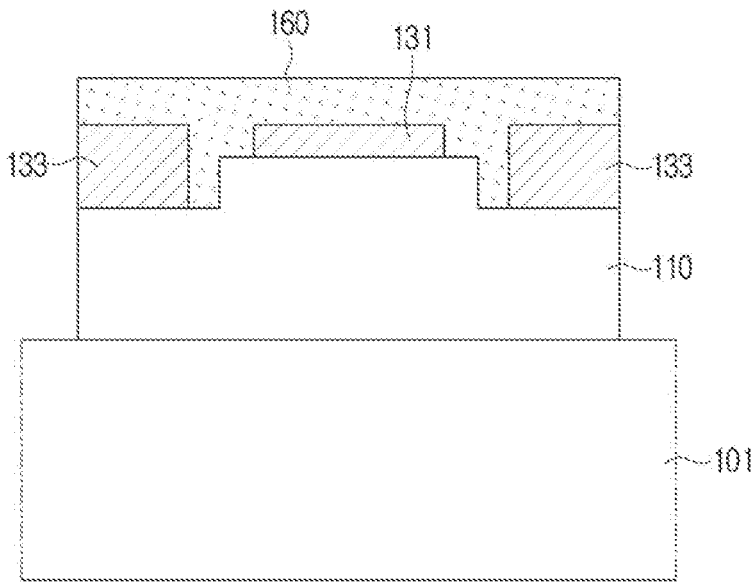

Referring to FIG. 7, the insulating layer 160 may be formed to a predetermined thickness on the first and second semiconductor layers to cover both the first and second electrodes 131 and 133 (43). The insulating layer 160 may be formed through, for example, the deposition process.

Figure 8:
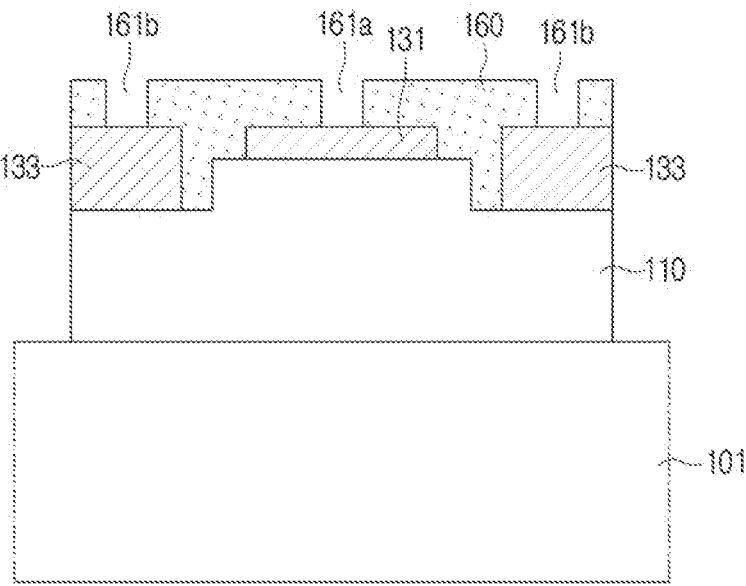

Referring to FIG. 8, the first and second vias 161a and 161b may be formed at the insulating layer 160 (44).

The first via 161a may be formed so that a part of the first electrode 131 is exposed. In this case, a width of the first via 161a may be formed narrower than the width of the first electrode 131. The width of the first via 161*a* may determine the width of the first conductive member 151 which will be described below.

In addition, the second via 161*b* may be formed so that a part of the second electrode 133 is exposed. In this case, a width of the second via 161*b* may be formed narrower than the width of the second electrode 133. The second via 161*b* may be formed roughly as a ring shape corresponding to the shape of the second electrode 133, or formed as an arc shape according to the shape of the second electrode 133.

The second via 161*b* formed as described above may be formed as one element. However, embodiments are not limited thereto, and the second via 161*b* may be formed in multiple elements arranged at a certain distance from each other on the second electrode 133.

The width of the second via 161*b* may determine the width of the second conductive member 153 which will be described below.

Figure 9:
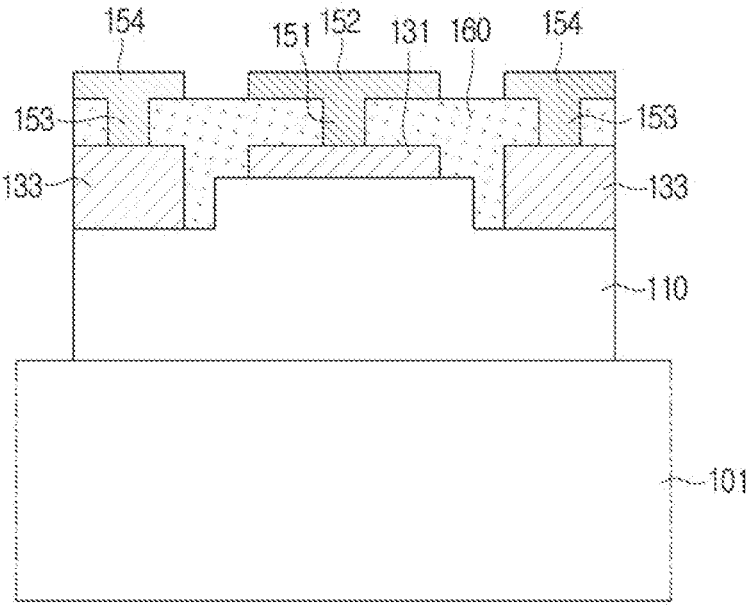

Referring to FIG. 9, the conductive members 151 and 152 may be filled in the first vias 161*a* and the conductive members 153 and 154 may be filled in the second vias 161*b* (45). In this case, a portion of the conductive members 151 and 153 may be filled in the first and second vias 161*a* and 161*b* and the remaining conductive members 152 and 154 may be formed on the insulating layer 160.

Figure 10:
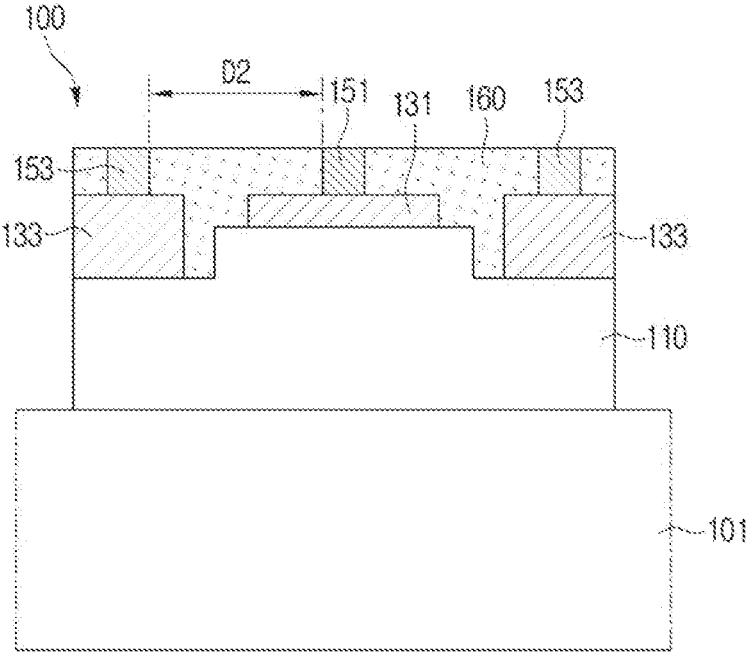

Referring to FIG. 10, a polishing process may be performed to remove the remaining conductive members 152 and 154 (46). In this case, because a part of a top surface of the insulating layer 160 is also removed as the remaining conductive members 152 and 154 are removed, an overall flatness may be maintained.

Based on the remaining portions of the conductive members 152 and 154 being removed, the portion of the conductive members 151 and 153 may become the first conductive member 151 which contacts with the first electrode 131 and the second conductive member 153 which contacts with the second electrode 133.

The distance D2 between the first and second conductive members 151 and 153 may be formed wider than the distance D1 between the first and second electrodes 131 and 133. The first and second conductive members 151 and 153 may be directly coupled to first and second electrode pads 231 and 233 (referring to FIG. 13) of the substrate, respectively, in place of the first and second electrodes 131 and 133 in the transferring process which will be described below. Accordingly, a short may be prevented from occurring between the first and second electrodes 131 and 133 because the distance D1 between the first and second electrodes 131 and 133 is narrow.

Figure 11:
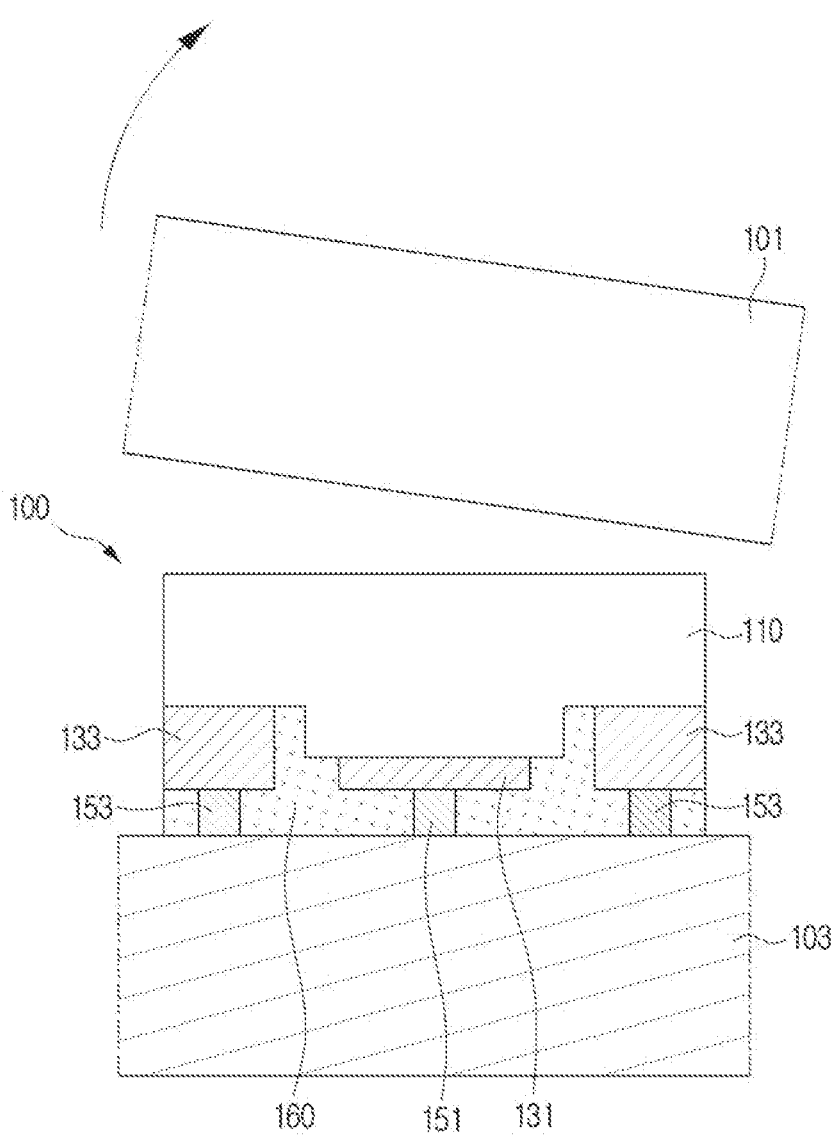
Figure 13:
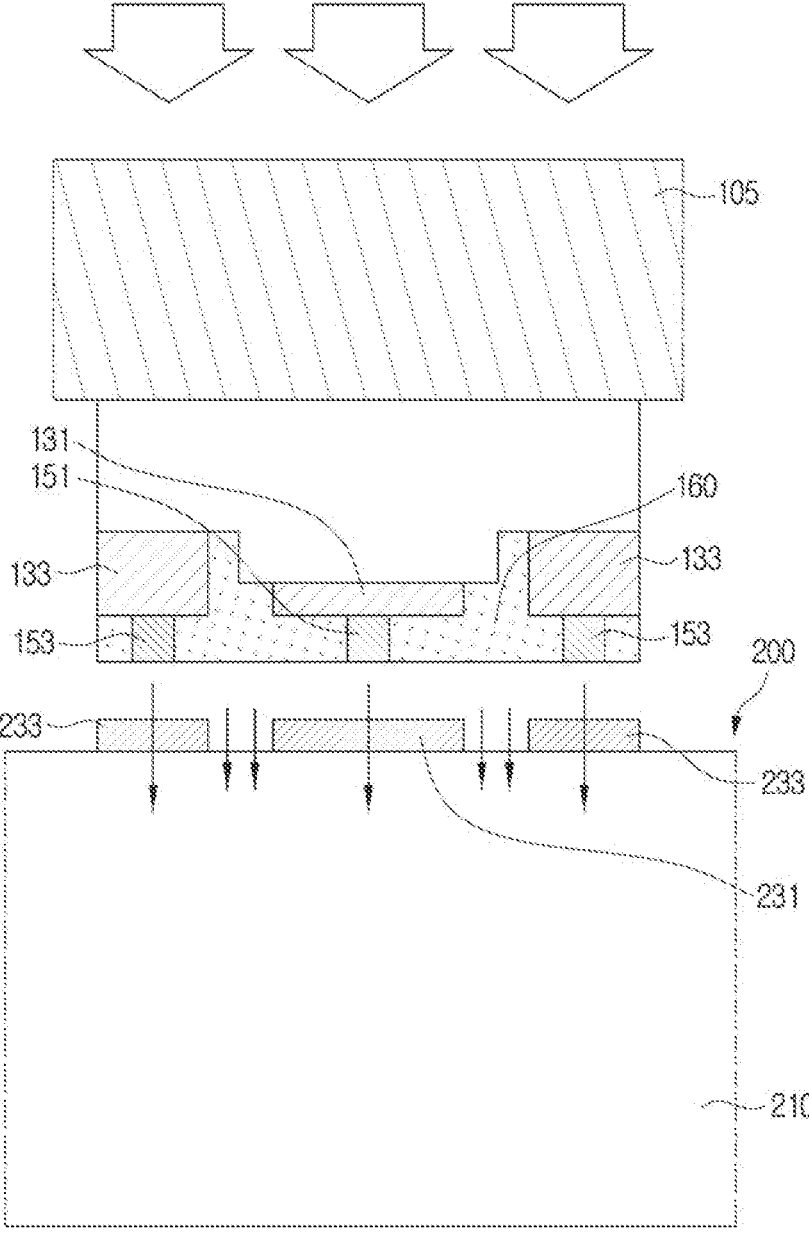

Referring to FIG. 11, the inorganic light emitting device 100 manufactured through the above-described processes may be separated from the epitaxial substrate 101 to transfer to the substrate 210 (referring to FIG. 13). In this case, the inorganic light emitting device 100 may be attached to one surface of a temporary substrate 103 prior to separating the inorganic light emitting device 100 from the epitaxial substrate 101. The epitaxial substrate 101 and the inorganic light emitting device 100 may be separated using a laser lift-off method in this state.

Figure 12:
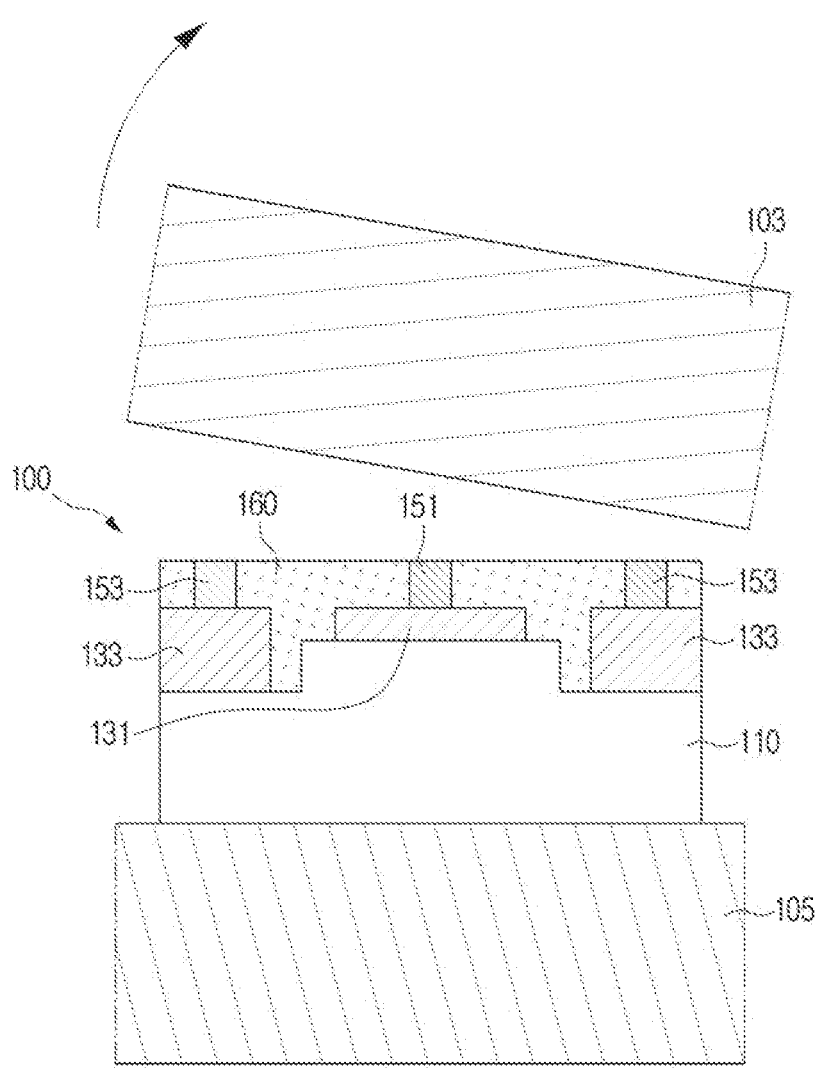

Referring to FIG. 12, the inorganic light emitting device 100 which is transferred to the temporary substrate 103 may be transferred to a relay substrate 105 for the transferring process. In this case, the light emitting surface 110*a* of the inorganic light emitting device 100 may be attached to the relay substrate 105. The temporary substrate 103 may be separated from the inorganic light emitting device 100 using the laser lift-off method.

Referring to FIG. 13, the inorganic light emitting device 100 transferred to the relay substrate 105 may be transferred to a TFT substrate 200 while the first and second conductive members 151 and 153 are disposed toward the first and second electrode pads 231 and 233 of the TFT substrate.

In this case, the TFT substrate 200 may be formed of one from among a glass substrate, a synthetic resin-based (e.g., polyimide (PI), polyethylene terephthalate (PET), polyethersulfone (PES), polyethylene naphthalate (PEN), polycarbonate (PC), etc.) substrate having a flexible material, or a ceramic substrate. In addition, the TFT substrate 200 may be disposed with the TFT layer on which the TFT circuit is formed at the front surface of the substrate. In this case, the TFT layer may be formed integrally on the substrate or attached to one surface of the substrate manufactured in a separate film form.

The inorganic light emitting device 100 may be transferred from the relay substrate 105 to the TFT substrate 200 through the transferring process such as a stamping transfer, a laser transfer, and a rollable transfer.

Figure 14:
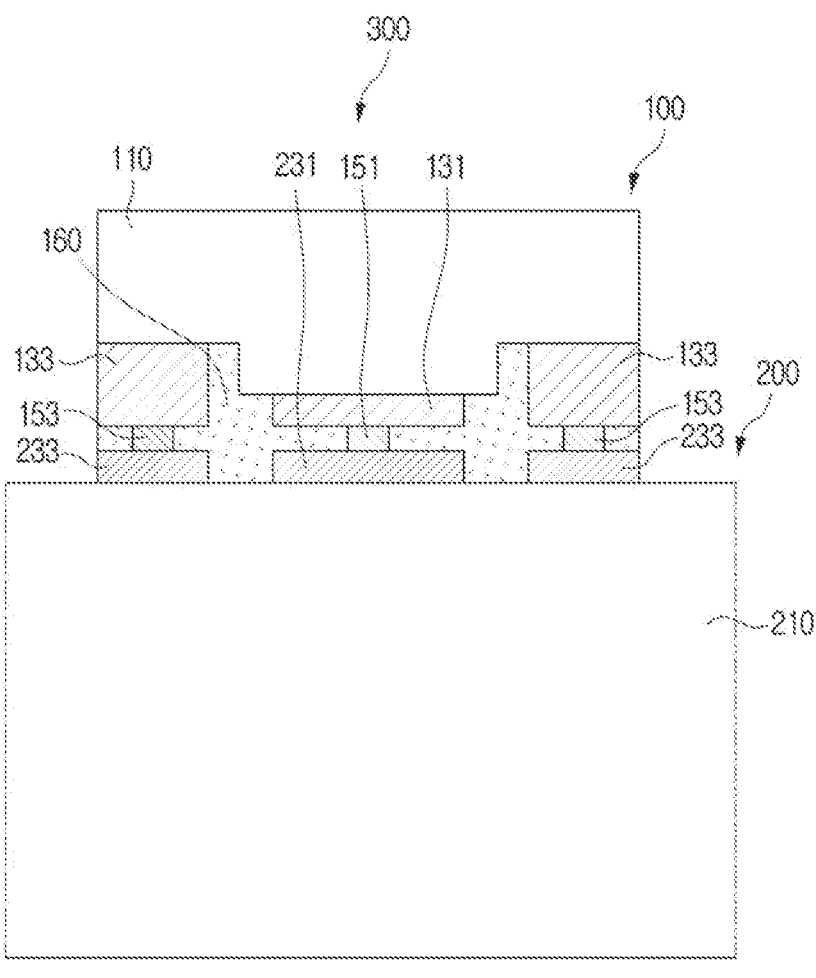

Referring to FIG. 14, based on transferring the inorganic light emitting device 100 to the TFT substrate 200 through the transferring process, a display module 300 according to an embodiment of the disclosure may be manufactured.

The inorganic light emitting device 100 transferred to the TFT substrate 200 may be configured such that the first and second conductive members 151 and 153 are electrically coupled to the first and second electrode pads 231 and 233 of the TFT substrate, respectively. Accordingly, the first and second electrodes 131 and 133 of the inorganic light emitting device 100 may be electrically coupled to the first and second electrode pads 231 and 233 through the first and second conductive members 151 and 153.

In addition, the inorganic light emitting device 100 may be thermally compressed to the TFT substrate 200 when performing the transfer process. The pressing force when performing the thermal compression may be less than or equal to 200 MPa, and the temperature may be between 120° C. and 170° C.

The insulating layer 160 may function as the adhesive layer capable of strongly attaching the inorganic light emitting device 100 to the TFT substrate 200 as it melts. As described above, based on using the insulating layer 160 which is a non-conductive polymer as a bonding material, when thermal compressing the inorganic light emitting device to the TFT substrate, a short defect between the first and second electrodes 131 and 133 and the first and second electrode pads 231 and 233 may be prevented compared to when the ACF according to related art is used as the adhesive layer, and defects by squeeze-out may be minimized compared to the electrode bonding method.

In addition, based on stress generated between the first and second conductive members 151 and 153 and the first and second electrode pads 131 and 133 when performing the thermal compression being equally distributed by the insulating layer 160, a crack occurring in the inorganic light emitting device by the pressing force when performing the thermal compression may be minimized. In addition, because the insulating layer 160 which is a non-conductive polymer is capable of performing an under-filing and encapsulation role, not only may the reliability of the product be increased but also the stress applied to the inorganic light emitting device 100 may be absorbed, and the stress transferred between the first and second electrodes 131 and 133 due to bending of the TFT substrate 200 may be alleviated.

Figure 15:
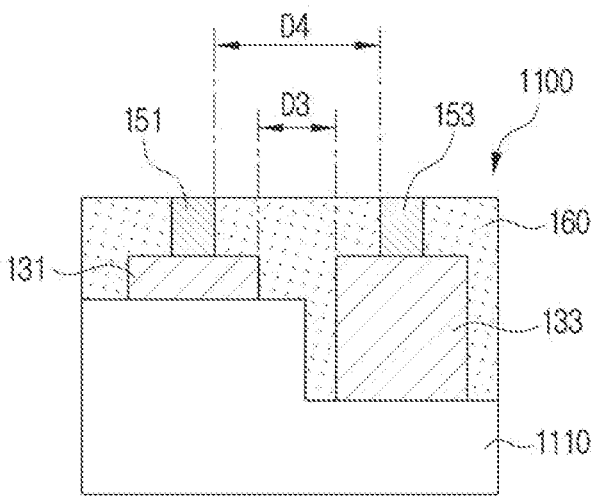
FIG. 15 is a cross-sectional view illustrating an inorganic light emitting device according to another embodiment.

FIG. 15 is a cross-sectional view illustrating an inorganic light emitting device according to another embodiment.

Referring to FIG. 15, the inorganic light emitting device according to another embodiment may be formed so that most of the configurations are similar with the inorganic light emitting device 100 described above, and an epitaxially grown part 1110 from the epitaxial substrate, that is a part in which the first semiconductor layer, the active layer, and the second semiconductor layer are stacked, may overall be formed roughly as a hexahedron. The insulating layer 160 may be configured to cover the opposite surface of the light emitting surface and the first and second electrodes 131 and 133.

In this case, a distance D4 between the first and second conductive members 151 and 153 may be formed wider than a distance D3 between the first and second electrodes 131 and 133.

The embodiments according to an embodiment described above describe inorganic light emitting devices 100 and 1100 including the first and second conductive members 151 and 153 and the insulating layer 160, but is not limited thereto. For example, similar to the display module according to still another embodiment of the disclosure described below, it may be possible for the first and second conductive members and the insulating layer to be formed at the TFT substrate.

The inorganic light emitting devices 100 and 1100 according to an embodiment may be transferred to the TFT substrate through a fluidic self-assembly (FSA) transferring method.

Figure 16:
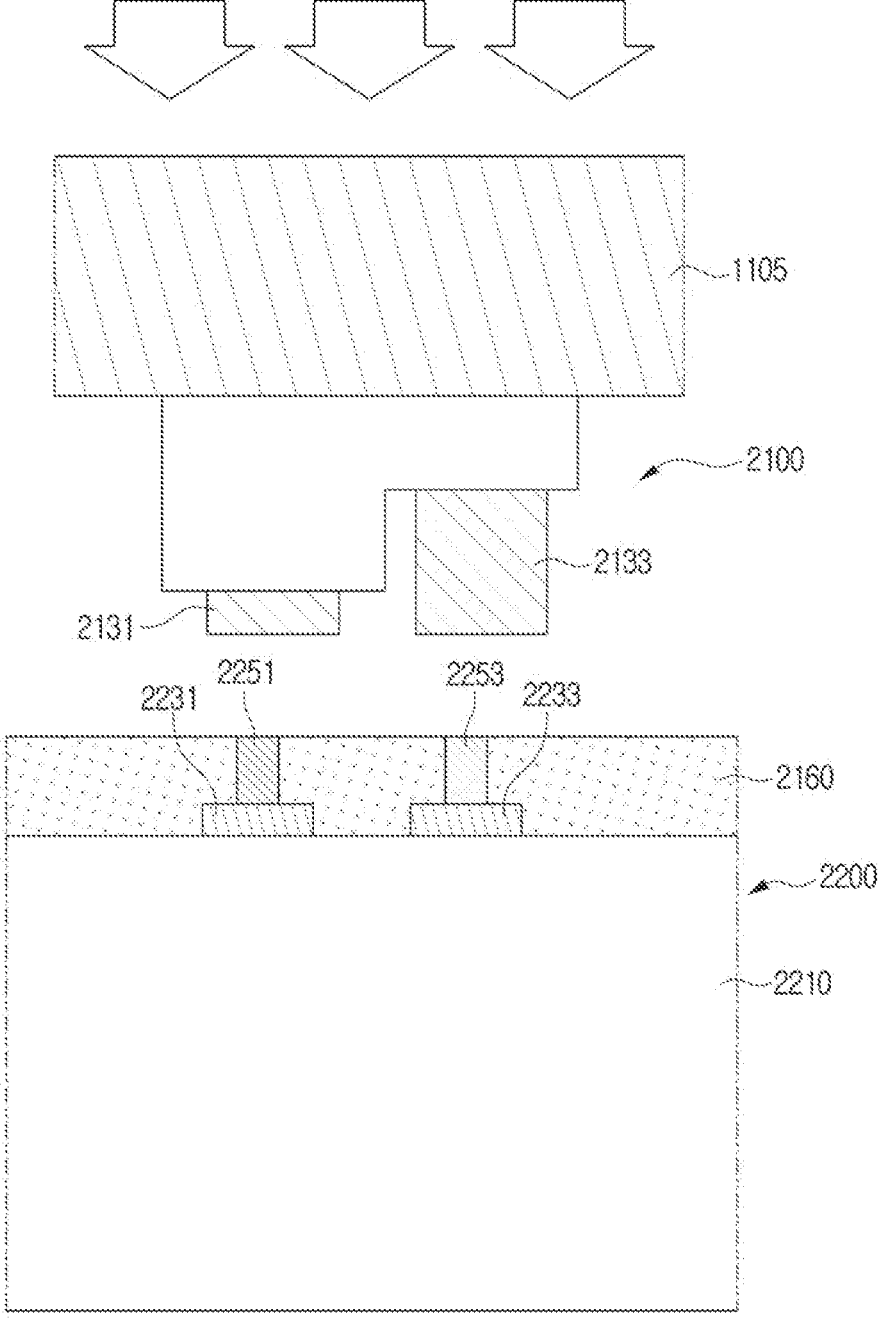
FIG. 16 is a cross-sectional view illustrating a display module according to another embodiment.

FIG. 16 is a cross-sectional view illustrating a display module according to another embodiment.

Referring to FIG. 16, a TFT substrate 2200 may be formed with an insulating layer 2160 configured to cover a first electrode pad 2231 and a second electrode pad 2233 on a TFT layer. The insulating layer 2160 may be formed with a via at respective positions corresponding to the first and second electrode pads 2231 and 2233, and the respective vias may be filled with a first conductive member 2251 and a second conductive member 2253.

A width of the first conductive member 2251 may be formed narrower than a width of the first electrode pad 2231, and a width of the second conductive member 2253 may be formed narrower than a width of the second electrode 2233. In this case, a distance between the first and second conductive members 2251 and 2253 may be formed wider than a distance between the first and second electrode pads 2231 and 2233.

As described above, a typical inorganic light emitting device 2100 may be transferred to the insulting layer 2160 and the TFT substrate 2200 on which the first and second conductive members 2251 and 2253 are formed.

In this case, the insulting layer 2160 may prevent, based on being formed of a non-conductive polymer like the embodiments described above, a short from occurring between the first and second electrodes 2131 and 2133 and between the first and second conductive members 2251 and 2253 of the inorganic light emitting device 2100 when thermally compressing the inorganic light emitting device 2100 arranged on a relay substrate 1105 to the TFT substrate 2200.

In addition, because pressure applied to the inorganic light emitting device 2100 and the TFT substrate 2200 when thermally compressing can be absorbed by the insulting layer 2160, a crack occurring due to stress to the inorganic light emitting device 2100 and the TFT substrate 2200 may be minimized.

The inorganic light emitting device 2100 may be transferred to a TFT substrate 2210 through the fluidic self-assembly (FSA) transferring method while a separate guide member is disposed on the TFT substrate 2210 according to an embodiment. In this case, the guide member may be formed as a mold formed with multiple guide grooves. The multiple guide grooves may be formed to correspond to a position at which the respective inorganic light emitting device 2100 are connected at the TFT substrate 2200.

In the above, various embodiments of the disclosure have been described respectively and individually, but the respective embodiments may not necessarily be implemented on its own, and the configuration and operation of the respective embodiments may be realized in combination with at least one other embodiment.

While example embodiments have been described with reference to the figures, it will be understood by those of ordinary skill in the art that various changes in form and details may be made therein without departing from the spirit and scope as defined by the following claims and their equivalents.

What is claimed is:

1. An inorganic light emitting device, comprising:
a first semiconductor layer;
a second semiconductor layer;
an active layer disposed between the first semiconductor layer and the second semiconductor layer;
a first electrode coupled to the first semiconductor layer;
a second electrode coupled to the second semiconductor layer;
an insulating layer covered the first electrode and the second electrode, and comprising via holes at positions corresponding to the first electrode and the second electrode; and
a first conductive member and a second conductive member coupled to the first electrode and the second electrode, respectively, through the via holes,
wherein a distance between the first conductive member and the second conductive member is greater than a distance between the first electrode and the second electrode,
wherein the second electrode penetrates the first semiconductor layer and the active layer and directly contacts the second semiconductor layer, the active layer, and the first semiconductor layer,
wherein the second electrode contacts an upper surface and a side surface of the first semiconductor layer, a side surface of the active layer, and an upper surface of the second semiconductor layer,
wherein the second electrode entirely surrounds the first electrode,
wherein the insulating layer is configured to cover an opposite surface of a light emitting surface and the first and second electrodes, and
wherein the insulating layer functions as an adhesive layer.

2. The inorganic light emitting device of claim 1, wherein a width of the first conductive member is narrower than a width of the first electrode.

3. The inorganic light emitting device of claim 1, wherein a width of the second conductive member is narrower than a width of the second electrode.

4. The inorganic light emitting device of claim 1, wherein the first conductive member and the second conductive member comprises PEDOT:PSS (poly(3,4-ethylenedioxy-thiophene):poly(styrenesulfonate)).

5. The inorganic light emitting device of claim 1, wherein the insulating layer comprises benzo cyclo butene (BCB), polyimide or epoxy.

6. A display device comprising:

a substrate comprising a thin film transistor (TFT) layer that comprises a TFT circuit and a plurality of electrode pads on the TFT layer;

a plurality of inorganic light emitting devices respectively comprising a first electrode and a second electrode connected with the plurality of electrode pads, a first semiconductor layer coupled to the first electrode, and a second semiconductor layer coupled to the second electrode;

an active layer disposed between the first semiconductor layer and the second semiconductor layer;

an insulating layer between the substrate and the plurality of inorganic light emitting devices; and a first conductive member and a second conductive member configured to electrically connect the first electrode and the second electrode with the plurality of electrode pads, wherein a distance between the first conductive member and the second conductive member is greater than a distance between the first electrode and the second electrode, wherein the second electrode penetrates the first semiconductor layer and the active layer and directly contacts the second semiconductor layer, the active layer, and the first semiconductor layer, wherein the second electrode contacts an upper surface and a side surface of the first semiconductor layer, a side surface of the active layer, and an upper surface of the second semiconductor layer, wherein the second electrode entirely surrounds the first electrode, wherein the insulating layer is configured to cover an opposite surface of a light emitting surface and the first and second electrodes, and wherein the insulating layer functions as an adhesive layer.

7. The display device of claim 6, wherein the first conductive member is between the first electrode and a corresponding electrode pad among the plurality of electrode pads, and wherein the second conductive member is between the second electrode and another corresponding electrode pad among the plurality of electrode pads.

8. The display device of claim 7, wherein a width of the first conductive member is narrower than a width of the first electrode.

9. The display device of claim 7, wherein a width of the second conductive member is narrower than a width of the second electrode.

10. The display device of claim 6, wherein the insulating layer comprises vias formed at positions corresponding to the first electrode and the second electrode, and wherein the first conductive member and the second conductive member are disposed in the vias.

11. The display device of claim 6, wherein the plurality of inorganic light emitting devices respectively comprises the insulating layer and the first conductive member and the second conductive member.

12. A display device comprising:

a substrate comprising a thin film transistor (TFT) layer that comprises a first electrode pad and a second electrode pad;

an inorganic light emitting device comprising a first electrode and a second electrode electrically connected to the first electrode pad and the second electrode pad, respectively, a first semiconductor layer coupled to the first electrode, and a second semiconductor layer coupled to the second electrode;

an active layer disposed between the first semiconductor layer and the second semiconductor layer;

an insulating layer between the substrate and the inorganic light emitting device; and a first conductive member between the first electrode and the first electrode pad, and a second conductive member between the second electrode and the second electrode pad, wherein a distance between the first conductive member and the second conductive member is greater than a distance between the first electrode and the second electrode, wherein the second electrode penetrates the first semiconductor layer and the active layer and directly contacts the second semiconductor layer, the active layer, and the first semiconductor layer, wherein the second electrode contacts an upper surface and a side surface of the first semiconductor layer, a side surface of the active layer, and an upper surface of the second semiconductor layer, wherein the second electrode entirely surrounds the first electrode, wherein the insulating layer is configured to cover an opposite surface of a light emitting surface and the first and second electrodes, and wherein the insulating layer functions as an adhesive layer.

13. The display device of claim 12, wherein a width of the first conductive member is narrower than a width of the first electrode.

14. The display device of claim 12, wherein a width of the second conductive member is narrower than a width of the second electrode.

* * * * *